(12) United States Patent
Nakamura

(10) Patent No.: US 11,476,639 B2
(45) Date of Patent: Oct. 18, 2022

(54) OPTICAL APPARATUS

(71) Applicant: PANASONIC CORPORATION, Osaka (JP)

(72) Inventor: Koshi Nakamura, Osaka (JP)

(73) Assignee: PANASONIC HOLDINGS CORPORATION, Osaka (JP)

( * ) Notice: Subject to any disclaimer, the term of this patent is extended or adjusted under 35 U.S.C. 154(b) by 0 days.

(21) Appl. No.: 17/274,778

(22) PCT Filed: Sep. 6, 2019

(86) PCT No.: PCT/JP2019/035127
§ 371 (c)(1),
(2) Date: Mar. 9, 2021

(87) PCT Pub. No.: WO2020/054593
PCT Pub. Date: Mar. 19, 2020

(65) Prior Publication Data
US 2021/0359491 A1 Nov. 18, 2021

(30) Foreign Application Priority Data

Sep. 13, 2018 (JP) .............................. JP2018-171093

(51) Int. Cl.
*H01S 5/0222* (2021.01)
*H01S 5/0239* (2021.01)
(Continued)

(52) U.S. Cl.
CPC ........ *H01S 5/0239* (2021.01); *B23K 26/1464* (2013.01); *H01S 5/0222* (2013.01); *H01S 5/02315* (2021.01)

(58) Field of Classification Search
CPC ............. H01S 5/02222; H01S 5/02315; H01S 5/0239; B23K 26/1464
See application file for complete search history.

(56) References Cited

U.S. PATENT DOCUMENTS

2003/0132210 A1* 7/2003 Fujii ...................... B23K 26/14
219/121.84
2003/0214987 A1 11/2003 Yamanaka et al.
(Continued)

FOREIGN PATENT DOCUMENTS

JP 2002-144073 A 5/2002
JP 2004-014820 A 1/2004
(Continued)

OTHER PUBLICATIONS

International Search Report issued in corresponding International Patent Application No. PCT/JP2019/035127, dated Dec. 10, 2019, with English translation.

*Primary Examiner* — Michael Carter
(74) *Attorney, Agent, or Firm* — McDermott Will & Emery LLP

(57) ABSTRACT

An optical apparatus includes: an optical component opposed to and spaced apart from a light-emitting surface through which laser light is emitted; a case that houses a semiconductor laser element and the optical component and includes an introduction port for introducing gas and an exhaust port for exhausting the gas; and a flow passage section (i.e., a tubular body) including a spray port for spraying the semiconductor laser element with the gas introduced from the introduction port.

10 Claims, 14 Drawing Sheets

(51) Int. Cl.
*H01S 5/02315* (2021.01)
*B23K 26/14* (2014.01)

(56) References Cited

U.S. PATENT DOCUMENTS

2004/0096159 A1   5/2004   Nagano et al.
2017/0093124 A1*  3/2017   Nagarajan ............ H04B 10/501

FOREIGN PATENT DOCUMENTS

| JP | 2004-126001 A | 4/2004 |
| JP | 2004-128058 A | 4/2004 |
| JP | 2004-252425 A | 9/2004 |
| WO | 02/38324 A1 | 5/2002 |

* cited by examiner

OPTICAL APPARATUS

CROSS-REFERENCE OF RELATED APPLICATIONS

This application is the U.S. National Phase under 35 U.S.C. § 371 of International Patent Application No. PCT/JP2019/035127, filed on Sep. 6, 2019, which in turn claims the benefit of Japanese Patent Application No. 2018-171093, dated Sep. 13, 2018, the entire disclosures of which Applications are incorporated by reference herein.

TECHNICAL FIELD

The present disclosure relates to an optical apparatus including a semiconductor laser element.

Note that the present disclosure is filed as a patent application according to the research named "Development of Advanced Laser Processing with Intelligence based on High-Brightness and High-Efficiency Laser Technologies/Development on Gan-Based High-Power High-Beam Quality Semiconductor Lasers for Highly-Efficient Laser Processing" commissioned in 2016 of New Energy and Industrial Technology Development Organization (NEDO) under Article 17 of Industrial Technology Enhancement Act.

BACKGROUND ART

Using laser light, laser processing allows non-contact and fine processing as compared to background art. In particular, direct diode lasers using a semiconductor laser element as a light source do not convert laser light and are thus highly efficient. However, semiconductor laser elements have outputs of several watts per emitter (i.e., light-emitter). On the other hand, laser light used for processing needs to have optical output ranging from hundreds of watts to several kilowatts. Thus, if laser light is used for processing, semiconductor laser elements employ an array structure including a large number of aligned emitters, for example. A semiconductor laser element with a multi-emitter structure synthesizes laser light output from emitters to obtain high-output laser light.

For example, in an optical apparatus using a gallium nitride (GaN)-based semiconductor laser element, low-molecular-weight siloxane present in a package that houses the GaN-based semiconductor laser element reacts with laser light to adhere onto the facet of the semiconductor laser element, which degrades the laser characteristics. Tl address the problem, the inside of the package of a GaN-based semiconductor laser element is sealed airtight to reduce unclearness of the facet of the semiconductor laser element.

However, the sizes of semiconductor laser elements with a multi-emitter structure are as 80 times the sizes of semiconductor laser elements with a single emitter structure. It takes cost to seal the former semiconductor laser elements as a whole airtight. To address the problem, disclosed (see e.g., Patent Literature (PTL) 1) is a technique of reducing adhesion of dust or dirt onto the facet of a semiconductor laser element by the gas flowing inside the package that houses a semiconductor laser element.

CITATION LIST

Patent Literature

PTL 1: Japanese Unexamined Patent Application Publication No. 2002-144073

SUMMARY OF THE INVENTION

Technical Problems

It is however difficult in the technique disclosed in PTL 1 to cause gas to flow near the light-emitting surface of a semiconductor laser element, if an optical component such as a lens is opposed to the light-emitting surface of the semiconductor laser element at a distance of about 30 μm to about 200 μm. In addition, near the light-emitting surface of the semiconductor laser element, the gas remains and dust or dirt tends to be collected.

The present disclosure provides an optical apparatus capable of reducing adhesion of dust or dirt onto the facet of a semiconductor laser element.

Solution to Problem

An optical apparatus according to an aspect of the present disclosure includes: a semiconductor laser element that emits laser light; an optical component opposed to and spaced apart from a light-emitting surface through which the laser light is emitted; a case that houses the semiconductor laser element and the optical component, and includes an introduction port for introducing gas and an exhaust port for exhausting the gas; and a flow passage section including a spray port for spraying the semiconductor laser element with the gas introduced from the introduction port.

Advantageous Effect of Invention

The optical apparatus according to the present disclosure reduces adhesion of dust or dirt onto the facet of a semiconductor laser element.

DESCRIPTION OF EXEMPLARY EMBODIMENTS

Figure 1A:
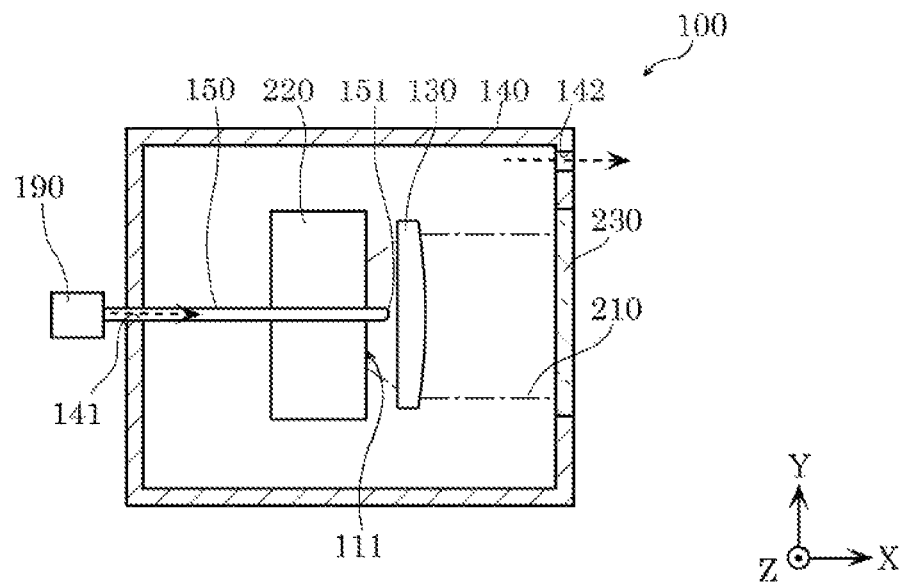
FIG. 1A is a top view showing an internal configuration of an optical apparatus according to Embodiment 1.

Now, embodiments of the present disclosure will be described in detail with reference to the drawings. Note that the embodiments described below are mere specific examples of the present disclosure. The numerical values, shapes, materials, constituent elements, the arrangement and connection of the constituent elements, steps, step orders etc. shown in the following embodiments are thus mere examples, and are not intended to limit the scope of the present disclosure. The present disclosure is limited only by the claims.

Among the constituent elements in the following embodiments, those not recited in any of the independent claims defining the broadest concept of the present disclosure will be described.

The figures are schematic representations and not necessarily drawn strictly to scale. Redundant descriptions of substantially the same constituent elements may be omitted.

In the specification and drawings, the X-, Y-, and Z-axes correspond to three axes of the three-dimensional orthogonal coordinate system. In the embodiments, the positive side of the Z-axis is located above, whereas the negative side of the Z-axis is located below. In this specification, the "thickness direction" means the direction in which the thickness of each optical apparatus extends, and which is perpendicular to the "mounting surface" of each case on which a semiconductor laser element is mounted. A "plan view" is seen in the direction perpendicular to the mounting surface. A "front view" is a view when the light-emitting surface of each semiconductor laser element is viewed in the direction perpendicular to the light-emitting surface.

In the drawings, the flow of gas is schematically indicated by broken arrows.

In this specification, the terms "upper" and "lower" do not mean "upward" (upper in the vertical direction) and "downward" (lower in the vertical direction) in the absolute spatial recognition. The terms "upper" and "lower" are applicable not only where two constituent elements are spaced apart from each other with another constituent element interposed therebetween but also where two constituent elements are close to each other and in contact with each other.

In this specification, the terms such as "parallel" indicating the positional relationships and such as "cuboid" indicating the shapes etc. include not only completely "parallel" or "perfect cuboid" but also include manufacturing errors. For example, the term "parallel" means "substantially parallel" including manufacturing errors. For example, the term "cuboid" means "substantial cuboid" including manufacturing errors.

Embodiment 1

Configuration

Figure 1B:
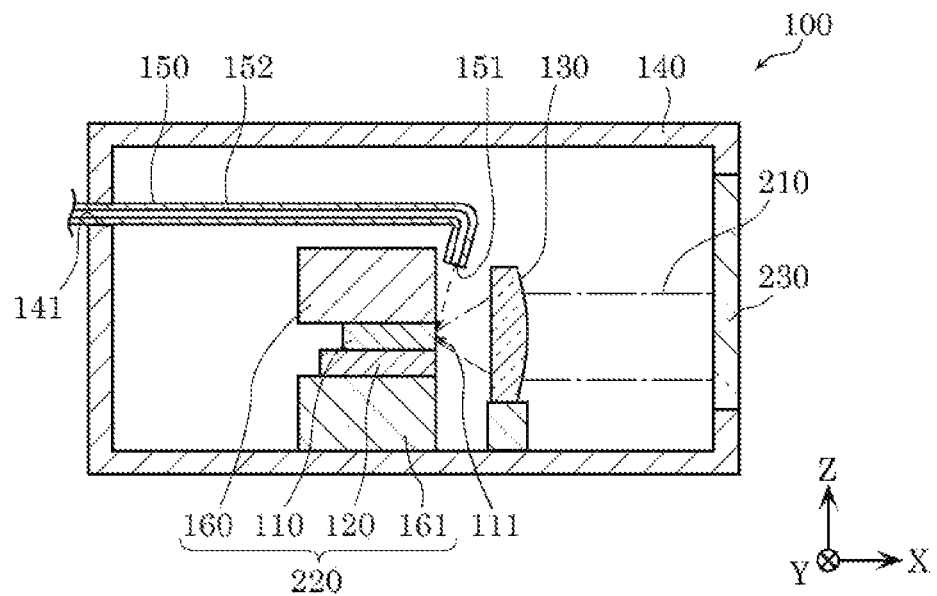
FIG. 1B is a side view showing the internal configuration of the optical apparatus according to Embodiment 1.
Figure 1C:
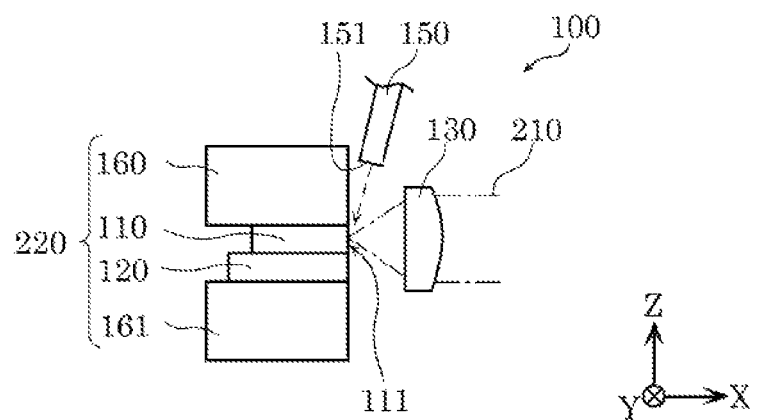
FIG. 1C is a partial side view showing the optical apparatus according to Embodiment 1.
Figure 1D:
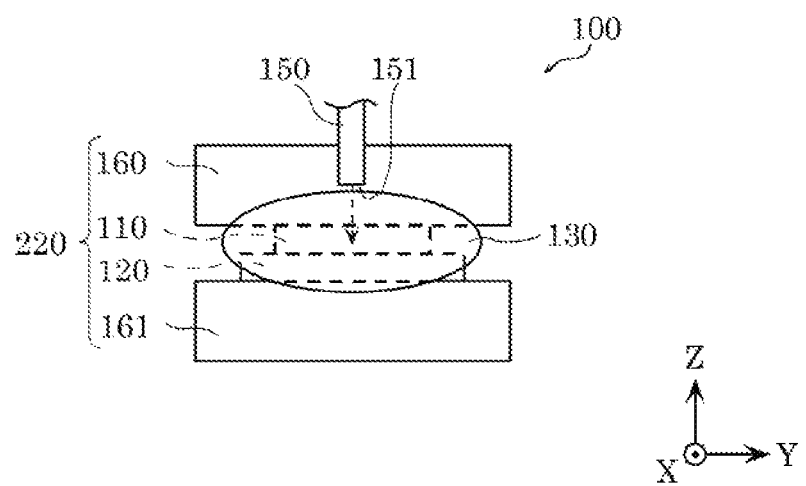
FIG. 1D is a partial front view showing the optical apparatus according to Embodiment 1.

FIG. 1A is a top view showing an internal configuration of optical apparatus 100 according to Embodiment 1. FIG. 1B is a side view showing the internal configuration of optical apparatus 100 according to Embodiment 1. FIG. 1C is a partial side view showing optical apparatus 100 according to Embodiment 1. FIG. 1D is a partial front view showing optical apparatus 100 according to Embodiment 1. Note that FIGS. 1C and 1D show only some of the constituent elements of optical apparatus 100.

Optical apparatus 100 is a laser module that emits laser light 210. Optical apparatus 100 is used as a laser source for a processing device for laser processing, for example. In this embodiment, optical apparatus 100 is what is called a "CAN package" laser diode module.

Optical apparatus 100 includes optical device 220, optical component 130, case 140, flow passage section (i.e., tubular body) 150, and gas supply device 190.

Optical device 220 emits laser light 210. Specifically, optical device 220 includes semiconductor laser element 110, submount substrate 120, and support members 160 and 161.

Semiconductor laser element 110 is a semiconductor element that emits laser light 210. Semiconductor laser element 110 emits from blue light to ultraviolet light with a wavelength ranging from about 350 nm to about 450 nm, for example. Semiconductor laser element 110 may be a single emitter laser diode with a single luminous point or may be a multi-emitter laser diode with a plurality of luminous points. Semiconductor laser element 110 is made of GaN-based or InGaN-based semiconductor, for example.

Mounted on submount substrate 120 is semiconductor laser element 110. The material employed for submount substrate 120 is not particularly limited but is a metal material such as CuW or a ceramic material such as AlN, for example.

Support members 160 and 161 support, in case 140, semiconductor laser element 110 mounted on submount substrate 120. Support members 160 and 161 are arranged in case 140 to sandwich semiconductor laser element 110 mounted on submount substrate 120 from above and below. The material employed for support members 160 and 161 is not particularly limited but is a metal material such as Cu, for example. Note that support members 160 and 161 may be made of a material with a high thermal conductivity. This material easily releases the heat generated in semiconductor laser element 110 into case 140.

Submount substrate 120 and support members 160 and 161 may have metal wires electrically connected to semiconductor laser element 110. For example, electric power is supplied to semiconductor laser element 110 via the metal wires and wires (not shown) in case 140.

Optical component 130 controls the distribution of laser light 210 emitted by semiconductor laser element 110 and transmits the controlled light. Optical component 130 is, in case 140, opposed to and spaced apart from light-emitting surface 111 of semiconductor laser element 110. Optical component 130 is a lens, for example. In this embodiment, optical component 130 is a collimator lens. In this embodiment, optical component 130 is a plano-convex lens with one flat surface, but may be a biconvex lens or a concave lens. As long as having light transmittance that transmits laser light 210 and capable of controlling the distribution of laser light 210, the shape of the optical component is not particularly limited. The material employed for optical component 130 may be a glass material or a resin material, for example, and may be selected freely. In addition, optical component 130 may be fixed to case 140 while being located in a lens holder, for example.

Case 140 is a housing that houses semiconductor laser element 110 and optical component 130. The shape of case 140 is not particularly limited but is a cuboid or a cylinder, for example. Case 140 includes, on its surface opposed to semiconductor laser element 110 (i.e., the surface at the positive side of the X-axis in this embodiment) translucent window 230 that transmits laser light 210. Translucent window 230 is a translucent member that transmits laser light 210. The translucent window is, for example, fitted into a through-hole in case 140 and fixed to case 140. The material employed for case 140 is not particularly limited but is metal, for example.

Case 140 includes introduction port 141 for introducing gas into case 140, and exhaust port 142 for exhausting the gas inside case 140 out of case 140. In this embodiment, case 140 include one introduction port 141 and one exhaust port 142 but may include a plurality of introduction ports 141 and a plurality of exhaust ports 142. Introduction port 141 and exhaust port 142 may be located in any positions in case 140. For example, case 140 may include introduction port 141 at the rear of case 140 (i.e., at the negative side of the X-axis in this embodiment), and exhaust port 142 at the front of case 140 (i.e., at the positive side of the X-axis in this embodiment). Alternatively, the case may include introduction port 141 at the front of case 140, and exhaust port 142 at the rear of case 140. For example, case 140 may include introduction port 141 in an upper position of case 140 (i.e., at the positive side of the Z-axis in this embodiment), and exhaust port 142 in a lower position of case 140 (i.e., at the negative side of the Z-axis in this embodiment). Alternatively, the case may include introduction port 141 in a lower position of case 140, and exhaust port 142 in an upper position of case 140. Introduction port 141 and exhaust port 142 may be located in the opposed surfaces of case 140.

Flow passage section (i.e., tubular body) 150 includes flow passage 152 that guides the gas introduced from introduction port 141 of case 140 to semiconductor laser element 110. More specifically, flow passage section 150 includes flow passage 152 that guides the gas introduced from introduction port 141 of case 140 to light-emitting surface 111 of semiconductor laser element 110. The gas introduced from introduction port 141 passes through flow passage 152 inside tubular body 150 and is sprayed out of spray port 151 onto light-emitting surface 111. Spray port 151 is placed in tubular body 150 to spray the gas on light-emitting surface 111 of semiconductor laser element 110. In this embodiment, flow passage section (i.e., tubular body) 150 included in optical apparatus 100 includes spray port 151. As shown in FIGS. 1B and 1C, spray port 151 is interposed between semiconductor laser element 110 and optical component 130 when viewed in the direction parallel to light-emitting surface 111, for example. For example, the gas is emitted from spray port 151 in the direction orthogonal to light-emitting surface 111.

Tubular body 150 includes flow passage 152 that connects introduction port 141 and spray port 151 together and allows the gas to pass. Specifically, tubular body 150 includes spray port 151 and is connected to introduction port 141. More specifically, tubular body 150 has one end connected to gas supply device 190 that supplies the gas. The gas supplied from gas supply device 190 passes through introduction port 141 and flow passage 152 and is exhausted from spray port 151 located at the other end of tubular body 150. Accordingly, the gas is sprayed on light-emitting surface 111 of semiconductor laser element 110. In this embodiment, tubular body 150 extends from introduction port 141 at the negative side of the X-axis in case 140 toward the positive side of the X-axis over light-emitting surface 111. The tubular body bends toward light-emitting surface Ill toward the negative sides of the X- and Z-axes.

In order to introduce the gas into case 140, gas supply device 190 supplies the gas via introduction port 141, specifically, introduction port 141 and flow passage 152 of tubular body 150 to spray port 151. For example, gas supply device 190 is a pump that supplies the gas.

Note that spray port 151 may be directly formed in case 140. In this case, introduction port 141 and spray port 151 may be identical.

Tubular body 150 may be integral with case 140 or separate from case 140.

Optical Characteristics

Now, optical characteristics of optical apparatus 100 will be described together with comparative examples.

Figure 2:
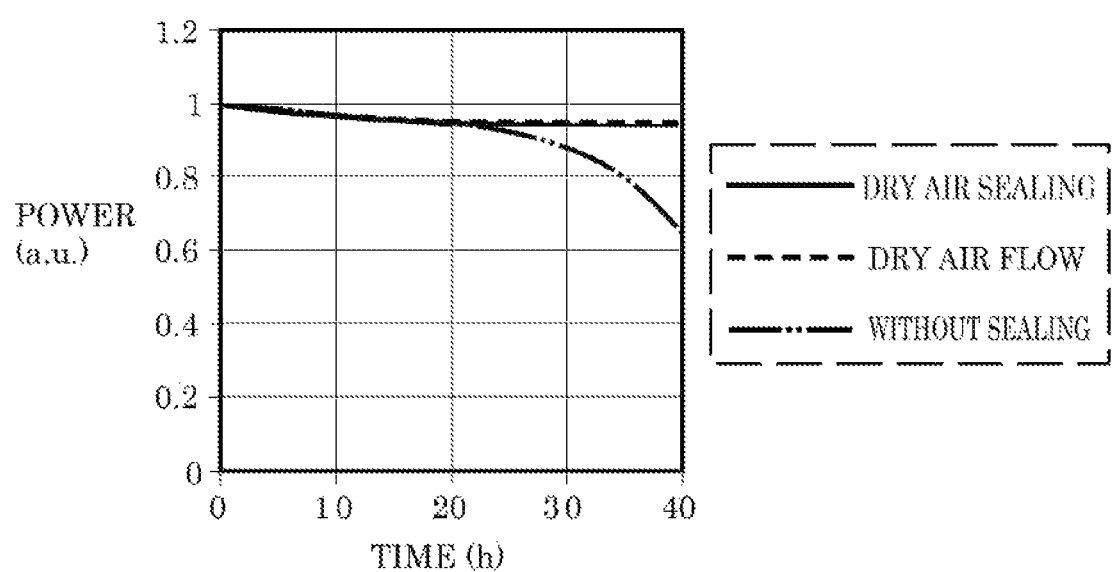
FIG. 2 is a graph showing a change in the optical characteristics of the optical apparatus according to Embodiment 1.

FIG. 2 is a graph showing a change in the optical characteristics of optical apparatus 100 according to Embodiment 1. Specifically, the graph shown in FIG. 2 shows an example change in optical output over time. In FIG. 2, a solid line represents an experiment result of the optical characteristics of optical apparatus 100 according to Embodiment 1. A broken line represents an experiment result of a comparative example where no gas is sprayed on light-emitting surface 111 and case 140 is sealed airtight by dry air. A two-dot chain line represents an experiment result of another comparative example where case 140 is not sealed airtight and no gas is sprayed on light-emitting surface 111. Note that the dry air, which is the gas used in optical apparatus 100 indicated by the solid line in the graph of FIG. 2, is the atmosphere after extracting moisture in the air, that is, the gas containing $N_2$ and $O_2$. Note that the experiment results are represented by values standardized by the optical output at the elapsed time 0.

It is found from the results shown in FIG. 2 that optical apparatus 100 exhibits optical characteristics the same or similar to those in the comparative examples sealed airtight, without sealing airtight. This may because the gas is sprayed on light-emitting surface 111 of optical apparatus 100 with no dust adhering so that the facet remains clean. The gas sprayed on light-emitting surface 111 may contain at least one of nitrogen, hydrogen, helium, argon, halogen-based gas, or halogen compound gas in addition to oxygen.

Advantageous Effects

As described above, optical apparatus 100 according to Embodiment 1 includes semiconductor laser element 110, optical component 130, case 140, and flow passage section (i.e., tubular body) 150. Semiconductor laser element 110 emits laser light 210. Optical component 130 is opposed to and spaced apart from light-emitting surface 111 through which laser light 210 is emitted. Case 140 houses semiconductor laser element 110 and optical component 130, and includes introduction port 141 for introducing gas and exhaust port 142 for exhausting the gas. Flow passage section (i.e., tubular body) 150 includes spray port 151 for spraying the gas introduced from introduction port 141 on semiconductor laser element 110. More specifically, flow passage section 150 includes spray port 151 for spraying the gas introduced from introduction port 141 on light-emitting surface 111 of semiconductor laser element 110.

The constituent elements, such as optical device 220 or optical component 130, of optical apparatus 100 may be fixed to case 140 by a resin material, such as a silicone resin, containing Si. If semiconductor laser element 110 emits laser light 210, such as blue or purple light, with a smaller wavelength; substances, such as siloxane, containing Si vaporized inside case 140 may react with laser light 210 and be then solidified. These substances adhering as dust or dirt onto light-emitting surface 111 degrade the optical characteristics of semiconductor laser element 110. Tb address the problem, optical apparatus 100 includes spray port 151 for spraying gas on light-emitting surface 111.

Assume that semiconductor laser element 110 and optical component 130 are close to each other at a distance of about 30 μm to about 200 μm inside case 140, for example. The configuration described above directly or indirectly sprays the gas on the facet of semiconductor laser element 110, that is, light-emitting surface 111. For example, the gas sprayed on semiconductor laser element 110 flows around to light-emitting surface 111. This reduces adhesion of dust or dirt onto the facet of semiconductor laser element 110, that is, light-emitting surface 111. Accordingly, the optical characteristics of semiconductor laser element 110, specifically, the optical output over time shown in FIG. 2 is less degraded. The gas sprayed on semiconductor laser element 110 reduces a rise in the temperature of semiconductor laser element 110, that is, reduces the temperature of semiconductor laser element 110. Accordingly, semiconductor laser element 110 has less changed optical characteristics such as a stable optical output.

For example, flow passage section 150 includes spray port 151 for spraying light-emitting surface 111 of semiconductor laser element 110 with the gas introduced from introduction port 141. The spray port directly sprays the gas on the facet of semiconductor laser element 110, that is, light-emitting surface 111, if semiconductor laser element 110 and optical component 130 are close to each other at a distance of about 30 μm to about 200 μm inside case 140. Accordingly, the adhesion of dust or dirt onto the facet of semiconductor laser element 110, that is, light-emitting surface 111 is further reduced. As a result, the optical characteristics of semiconductor laser element 110, specifically, the optical output over time shown in FIG. 2 is less degraded.

For example, when viewed in the direction parallel to light-emitting surface 111, spray port 151 is interposed between semiconductor laser element 110 and optical component 130.

This configuration allows effective spraying of the gas on light-emitting surface 111 of semiconductor laser element 110. Accordingly, the adhesion of dust or dirt onto light-emitting surface 111 of semiconductor laser element 110 is reduced.

For example, tubular body 150 includes flow passage 152 that connects introduction port 141 and spray port 151 together and allows the gas to pass.

This configuration effectively guides the gas introduced from introduction port 141 to light-emitting surface 111 of semiconductor laser element 110. Accordingly, the adhesion of dust or dirt on to light-emitting surface 111 of semiconductor laser element 110 is further reduced.

For example, the gas sprayed on light-emitting surface 111 of semiconductor laser element 110 contains oxygen.

This reduces degradation in the optical output of optical apparatus 100 over time.

For example, the gas sprayed on light-emitting surface 111 of semiconductor laser element 110 contains at least one of nitrogen, hydrogen, helium, argon, halogen-based gas, or halogen compound gas in addition to oxygen.

Employment of these inert gases in addition to oxygen reduce degradation in the optical output of optical apparatus 100 over time. These gases have high thermal conductivities. The employment of gas with a high thermal conductivity reduces adhesion of dust or dirt onto light-emitting surface 111 of semiconductor laser element 110 and easily releases the heat generated in semiconductor laser element 110 from semiconductor laser element 110.

Variation 1

Figure 3A:
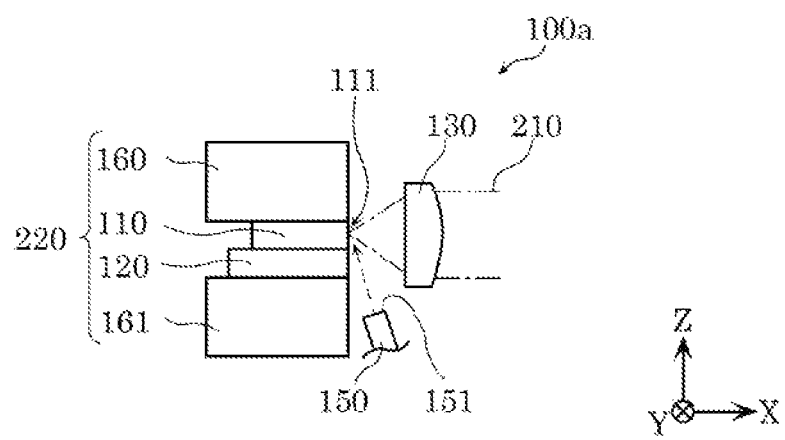
FIG. 3A is a partial side view showing an optical apparatus according to Variation 1 of Embodiment 1.
Figure 3B:
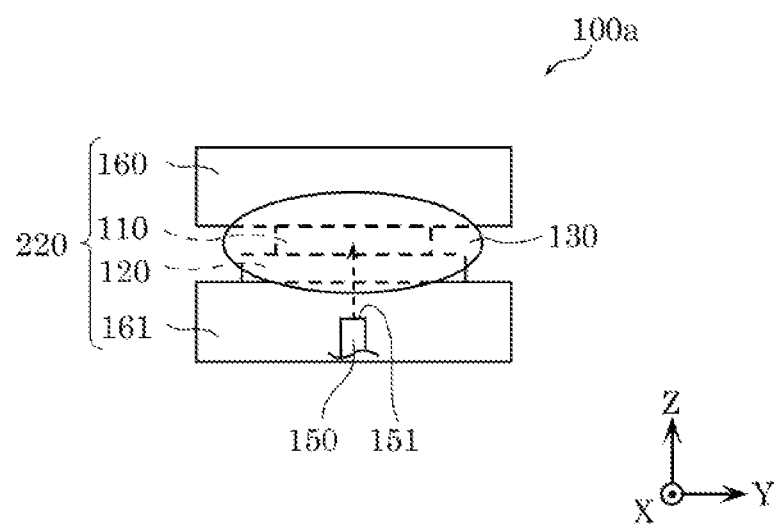
FIG. 3B is a partial front view showing the optical apparatus according to Variation 1 of Embodiment 1.

FIG. 3A is a partial side view showing optical apparatus 100a according to Variation 1 of Embodiment 1. FIG. 3B is a partial front view showing optical apparatus 100a according to Variation 1 of Embodiment 1. Note that FIGS. 3A and 3B show the constituent elements corresponding to those in FIGS. 1C and 1D and does not show some of the constituent elements such as case 140.

As shown in FIGS. 3A and 3B, spray port 151 is located in a lower position in optical apparatus 100a. In this manner, spray port 151 may be located in any position as long as capable of spraying the gas on light-emitting surface 111.

Figure 4A:
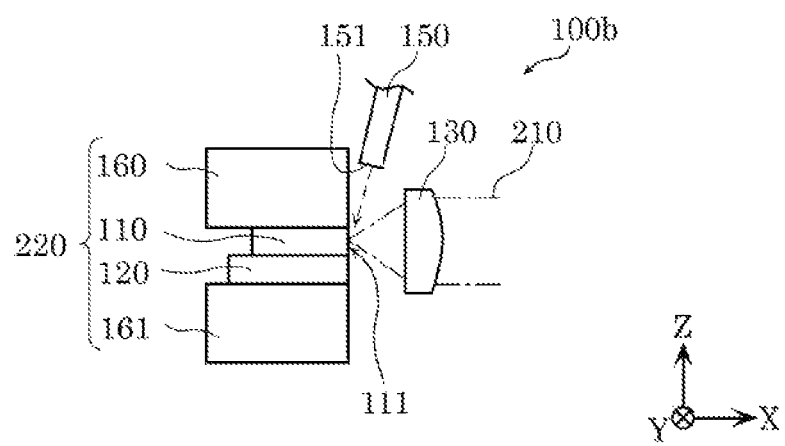
FIG. 4A is a partial side view showing an optical apparatus according to Variation 2 of Embodiment 1.
Figure 4B:
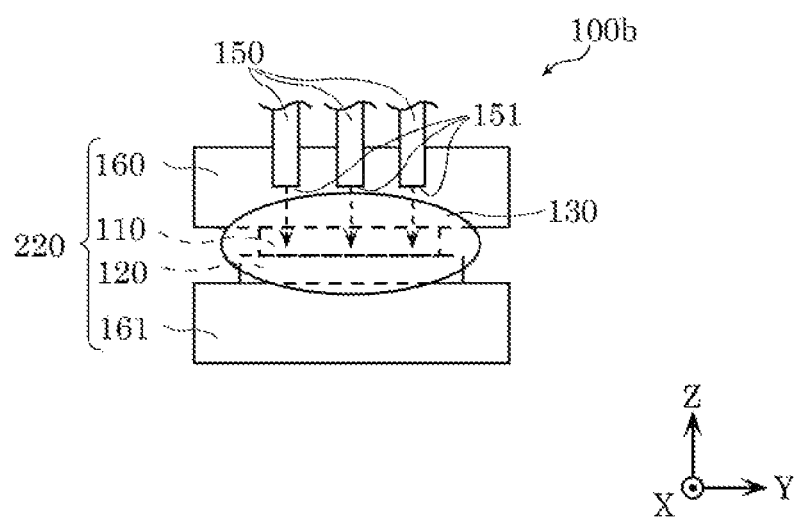
FIG. 4B is a partial front view showing the optical apparatus according to Variation 2 of Embodiment 1.

Variation 2 FIG. 4A is a partial side view showing optical apparatus 100b according to Variation 2 of Embodiment 1. FIG. 4B is a partial front view showing optical apparatus 100b according to Variation 2 of Embodiment 1. Note that FIGS. 4A and 4B show the constituent elements corresponding to those in FIGS. 1C and 1D and does not show some of the constituent elements such as case 140.

As shown in FIGS. 4A and 4B, optical apparatus 100b includes a plurality of spray ports 151. For example, optical apparatus 100b includes a plurality of tubular bodies 150 each including spray port 151. In this manner, optical apparatus 100b may include the plurality of spray ports 151.

Variation 3

Figure 5A:
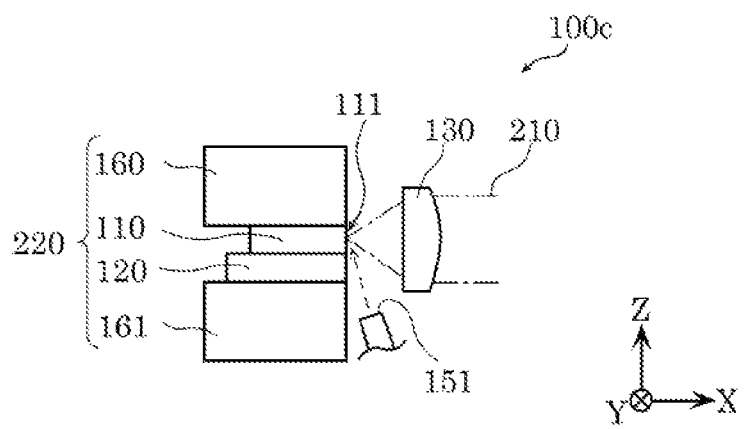
FIG. 5A is a partial side view showing an optical apparatus according to Variation 3 of Embodiment 1.
Figure 5B:
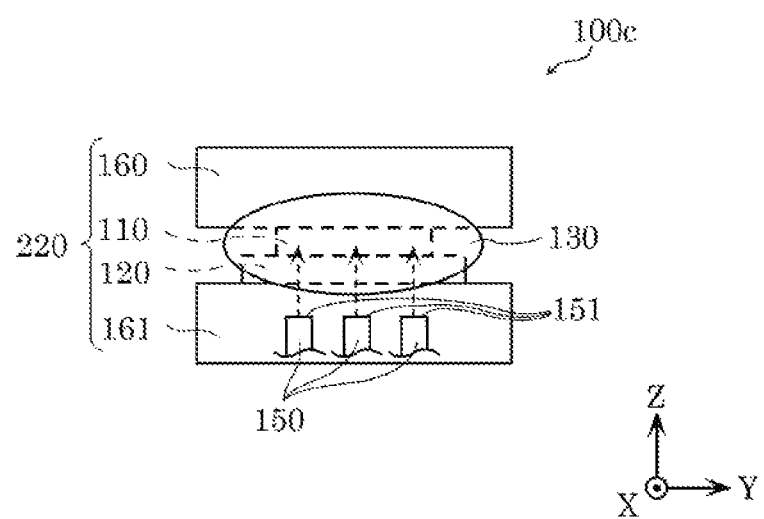
FIG. 5B is a partial front view showing the optical apparatus according to Variation 3 of Embodiment 1.

FIG. 5A is a partial side view showing optical apparatus 100c according to Variation 3 of Embodiment 1. FIG. 5B is a partial front view showing the optical apparatus according to Variation 3 of Embodiment 1. Note that FIGS. 5A and 5B show the constituent elements corresponding to those in FIGS. 1C and 1D and does not show some of the constituent elements such as case 140.

As shown in FIGS. 5A and 5B, spray port 151 is located in a lower position in optical apparatus 100c. Optical apparatus 100c includes a plurality of spray ports 151. For example, optical apparatus 100c includes a plurality of tubular bodies (not shown) each including spray port 151. In this manner, the configurations shown in the embodiment and variations may be combined freely.

Figure 6:
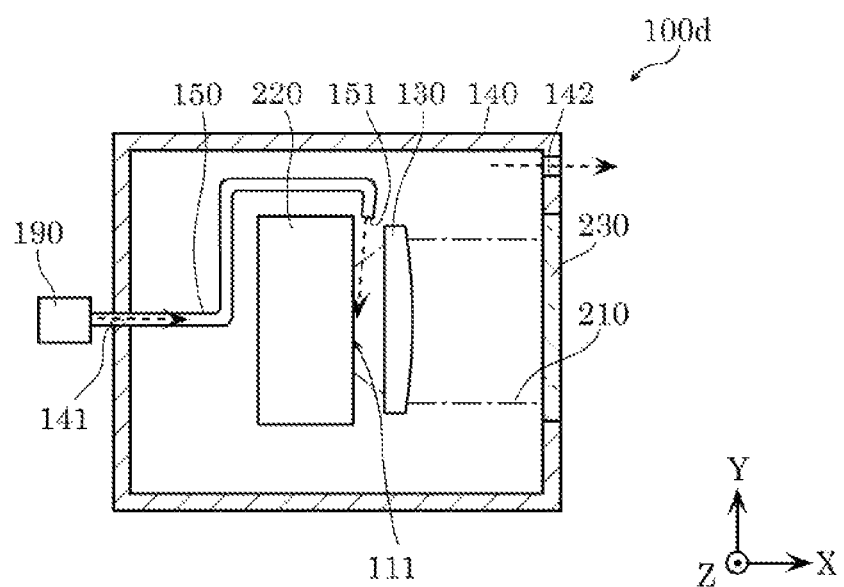
FIG. 6 is a top view showing an internal configuration of an optical apparatus according to Variation 4 of Embodiment 1.

Variation 4 FIG. 6 is a top view showing an internal configuration of an optical apparatus according to Variation 4 of Embodiment 1. Note that FIG. 6 is a top view corresponding to FIG. 1A.

As shown in FIG. 6, tubular body 150 included in optical apparatus 100d extends to pass not above optical device 220 but through a side of the optical device (i.e., in direction along the Y-axis in this embodiment). In optical apparatus 100d, spray port 151 is located on the side. In this manner, the position and orientation of tubular body 150 in case 140 may be determined freely.

Variation 5

Figure 7:
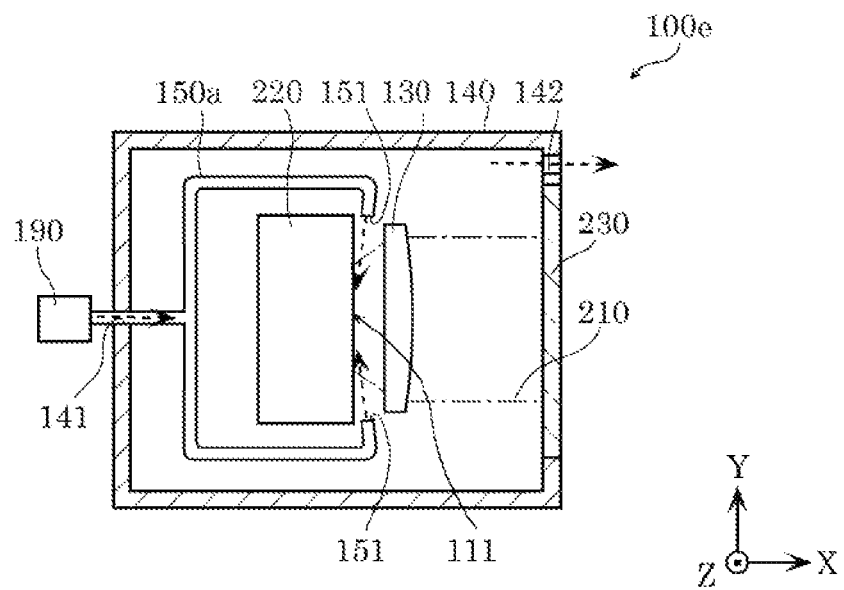
FIG. 7 is a top view showing an internal configuration of an optical apparatus according to Variation 5 of Embodiment 1.

FIG. 7 is a top view showing an internal configuration of an optical apparatus according to Variation 5 of Embodiment 1. Note that FIG. 7 is a top view corresponding to FIG. 1A.

As shown in FIG. 7, tubular body 150a included in optical apparatus 100e includes two spray ports 151. Specifically, tubular body 150a has one end connected to gas supply device 190, branches off from gas supply device 190 into two, and extends not above optical device 220 but through respective sides of optical device 220. In this manner, tubular body 150a may include the plurality of spray ports 151.

This configuration allows direct spraying of the gas on a wider area of light-emitting surface 111 of semiconductor laser element 110. Accordingly, the adhesion of dust or dirt onto light-emitting surface 111 of semiconductor laser element 110 is reduced. In particular, if semiconductor laser element 110 is a multi-emitter including a plurality of luminous points, a plurality of spray ports 151 are provided to spray the gas on the plurality of luminous points. For example, even if semiconductor laser element 110 is a multi-emitter, the adhesion of dust or dirt onto the plurality of luminous points can be reduced.

Note that the positions of the plurality of spray ports 151 inside case 140 may be determined freely.

Embodiment 2

Now, an optical apparatus according to Embodiment 2 will be described with reference to FIGS. 8 and 9.

In the description of the optical apparatus according to Embodiment 2, substantially the same reference characters as those of optical apparatus 100 according to Embodiment 1 are used to represent equivalent elements, and the redundant explanation thereof may be omitted or simplified.

Configuration

Figure 8:
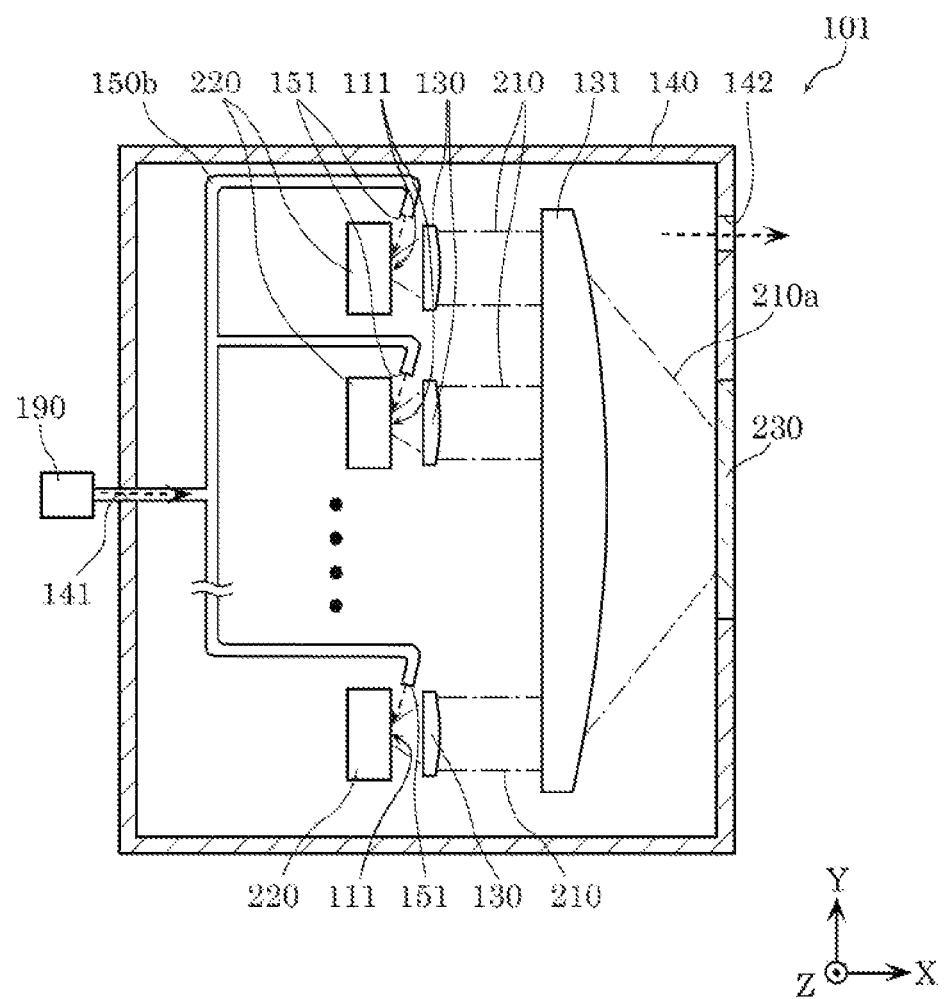
FIG. 8 is a top view showing an internal configuration of an optical apparatus according to Embodiment 2.

FIG. 8 is a top view showing an internal configuration of optical apparatus 101 according to Embodiment 2 Note that FIG. 8 is a top view corresponding to FIG. 1A.

Optical apparatus 101 is a laser module that emits laser light 210. Optical apparatus 101 is used as a laser source for a processing device for laser processing, for example. In this embodiment, optical apparatus 101 is what is called a "CAN package" laser diode module.

Optical apparatus 101 includes a plurality of optical devices 220, a plurality of optical components 130, optical component 131, case 140, and tubular body 150b with a plurality of spray ports 151. Optical apparatus 101 according to Embodiment 2 is different from optical apparatus 100 according to Embodiment 1 in the following. The system includes the plurality of optical devices 220, that is, the plurality of semiconductor laser elements 110. Optical components 130 and spray ports 151 are provided corresponding to the plurality of semiconductor laser elements 110.

The plurality of optical components 130 are in one-to-one correspondence to the plurality of optical devices 220, specifically, the plurality of semiconductor laser elements 110 and, in case 140, opposed to and spaced apart from light-emitting surfaces 111.

The plurality of spray ports 151 are in one-to-one correspondence to the plurality of optical devices 220, specifically, the plurality of semiconductor laser elements 110, and located in tubular body 150b to spray the gas on light-emitting surfaces 111. That is, tubular body 150b includes the plurality of spray ports 151. In addition, the plurality of spray ports 151 are arranged in one-to-one correspondence to the plurality of semiconductor laser elements 110. In this embodiment, one tubular body 150b included in optical apparatus 101 includes spray ports 151.

Tubular body 150b includes, inside, a flow passage that connects introduction port 141 and the plurality of spray ports 151 together and allows the gas to pass. Specifically, tubular body 150b includes the plurality of spray ports 151 and a part of tubular body 150b is located in introduction port 141. Tubular body 150b has one end connected to gas supply device 190 that supplies gas. The gas supplied from gas supply device 190 passes through the flow passage inside tubular body 150b and is exhausted from the plurality of spray ports 151 located at the other ends of tubular body 150b. Accordingly, the gas is sprayed on light-emitting surfaces 111 of respective semiconductor laser elements 110 included in the plurality of optical devices 220.

Tubular body 150b has one end connected to gas supply device 190, branches off from gas supply device 190 into the number of optical devices 220, and extends. The branches extend to pass through the sides of optical devices 220.

Note that optical apparatus 101 may include one tubular body 150b including the plurality of spray ports 151. For example, like optical apparatus 100c shown in FIGS. 5A and 5B, the plurality of tubular bodies 150 may be included and the gas may be sprayed out of respective spray ports 151 of tubular bodies 150 onto light-emitting surfaces 111 of semiconductor laser elements 110 included in optical devices 220.

Optical component 131 is a lens that collects laser light 210 that has passed through the plurality of optical components 130 and emits collected laser light 210a toward translucent window 230. Note that optical component 131 is a plano-convex lens with one flat surface, but may be a biconvex lens or a concave lens. As long as having light transmittance that transmits laser light 210a and capable of controlling the distribution of laser light 210a, the shape of the optical component is not particularly limited. The material employed for optical component 131 may be a glass material or a resin material, for example, and may be selected freely. In addition, optical component 131 may be fixed to case 140 while being located in a lens holder, for example.

Advantageous Effects

As described above, optical apparatus 101 according to Embodiment 2 includes the plurality of semiconductor laser element 110 and the plurality of spray ports 151 arranged in one-to-one correspondence to the plurality of semiconductor laser elements 110.

This configuration allows spraying of the gas on respective light-emitting surfaces 111 of the plurality of semiconductor laser elements 110. Accordingly, if the plurality of semiconductor laser elements 110 are included as in optical apparatus 101, the adhesion of dust or dirt onto respective light-emitting surfaces 111 of the plurality of semiconductor laser elements 110 can be reduced.

Variation

Figure 9:
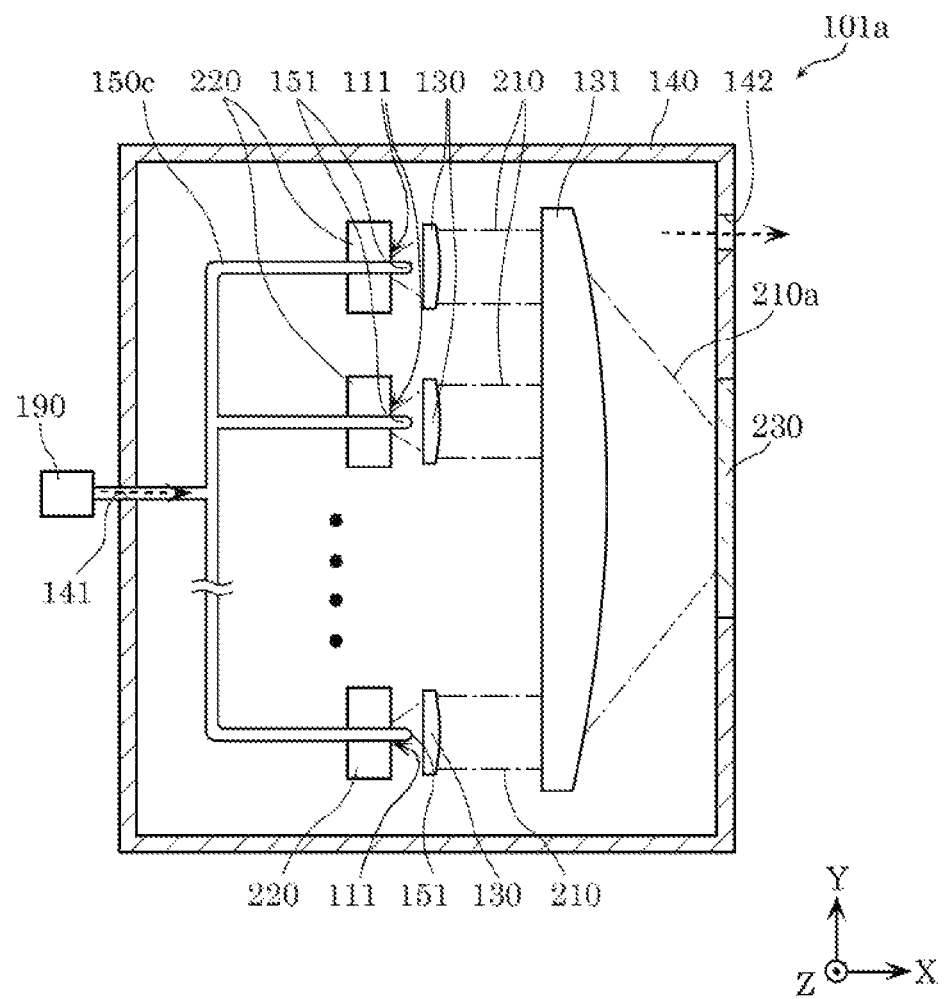
FIG. 9 is a partial top view showing an internal configuration of an optical apparatus according to a variation of Embodiment 2.

FIG. 9 is a partial top view showing an internal configuration of optical apparatus 101a according to a variation of Embodiment 2. Note that FIG. 9 is a top view corresponding to FIG. 1A.

Like optical apparatus 101, optical apparatus 101a includes a plurality of optical devices 220, a plurality of optical components 130, optical component 131, case 140, and a plurality of spray ports 151. Like optical apparatus 101, optical apparatus 101a includes the plurality of optical devices 220, that is, the plurality of semiconductor laser elements 110 (see e.g., FIG. 1B). Optical components 130 and spray ports 151 are provided corresponding to the plurality of semiconductor laser elements 110.

The plurality of spray ports 151 are holes in one-to-one correspondence the plurality of optical devices 220, specifically, the plurality of semiconductor laser elements 110 to spray the gas on light-emitting surfaces 111. That is, the plurality of spray ports 151 are arranged in one-to-one correspondence to the plurality of semiconductor laser elements 110a. In this variation, one tubular body 150c included in optical apparatus 101a includes the plurality of spray ports 151.

Tubular body 150c includes, inside, a flow passage that connects introduction port 141 and the plurality of spray ports 151 together and allows the gas to pass. Specifically, tubular body 150c includes the plurality of spray ports 151, and a part of tubular body 150c is located in introduction port 141. Tubular body 150c has one end connected to gas supply device 190 that supplies the gas. The gas supplied from gas supply device 190 passes through the flow passage inside tubular body 150c and is exhausted from the plurality of spray ports 151 located at the other ends of tubular body 150c. Accordingly, the gas is sprayed on light-emitting surfaces 111 of semiconductor laser elements 110 included in the plurality of optical devices 220.

Tubular body 150c has one end connected to gas supply device 190, branches off from gas supply device 190 into the number of optical devices 220, and extends. The branches extend to pass above optical devices 220. This configuration also allows spraying of the gas on respective light-emitting surfaces 111 of the plurality of semiconductor laser elements 110.

Embodiment 3

Figure 10:
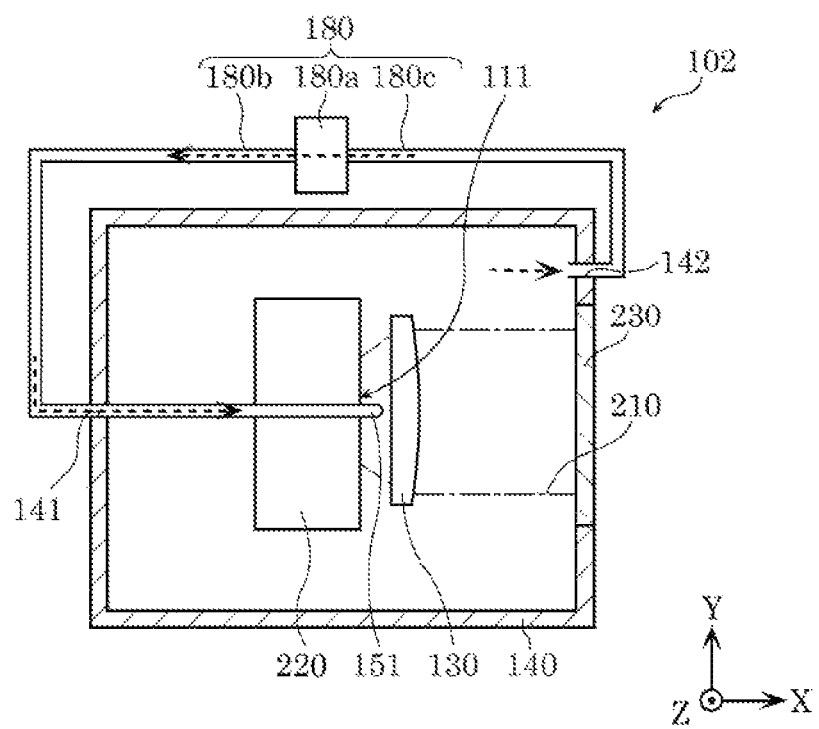
FIG. 10 is a partial top view showing an internal configuration of an optical apparatus according to Embodiment 3.

Now, an optical apparatus according to Embodiment 3 will be described with reference to FIG. 10.

In the description of the optical apparatus according to Embodiment 3, substantially the same reference characters as those of optical apparatus 100 according to Embodiment 1 are used to represent equivalent elements, and the redundant explanation thereof may be omitted or simplified.
Configuration FIG. 10 is a partial top view showing an internal configuration of optical apparatus 102 according to Embodiment 3.

Optical apparatus 102 includes optical device 220, optical component 130, case 140, and tubular body 150 with spray port 151. Optical apparatus 102 also includes circulation device 180.

Circulation device 180 is connected to introduction port 141 and exhaust port 142 outside case 140, and circulates the gas inside case 140 by exhausting the gas from exhaust port 142 and introducing, from introduction port 141, the gas exhausted from exhaust port 142. Circulation device 180 includes gas supply device 180a, tubular body 180b, and tubular body 180c, for example.

Gas supply device 180a supplies the gas supplied from tubular body 180c to tubular body 180b to calculate the gas inside case 140. Gas supply device 180a includes a pump for circulating the gas, and a filter for removing dust in the gas, for example.

Tubular body 180b includes, inside, a flow passage through which the gas passes, and has one end connected to gas supply device 180a and the other end connected to introduction port 141. In this embodiment, tubular body 180b extends from introduction port 141 and is connected to spray port 151.

Tubular body 180c includes, inside, the flow passage through which the gas passes, and has one end connected to exhaust port 142 of case 140 and the other end connected to gas supply device 180a.
Advantageous Effects As described above, optical apparatus 102 according to Embodiment 3 includes semiconductor laser element 110, optical component 130, case 140, and flow passage section 150. The optical apparatus further includes circulation device 180 that is connected to introduction port 141 and exhaust port 142 outside case 140 and circulates the gas inside case 140 by exhausting the gas from exhaust port 142 and introducing, from introduction port 141, the gas exhausted from exhaust port 142.

This configuration allows direct spraying of the gas on light-emitting surface 111 of semiconductor laser element 110. This reduces adhesion of dust or dirt onto light-emitting surface 111 of semiconductor laser element 110. If the gas inside case 140 circulated and used to adjust the concentrations of the components, such as oxygen, in the gas, for example, the concentrations of the components in the gas are adjusted once to continuously spray the gas with the adjusted concentrations on light-emitting surface 111.

Embodiment 4

Now, an optical apparatus according to Embodiment 4 will be described with reference to FIGS. 11A to 14B.

Figure 11A:
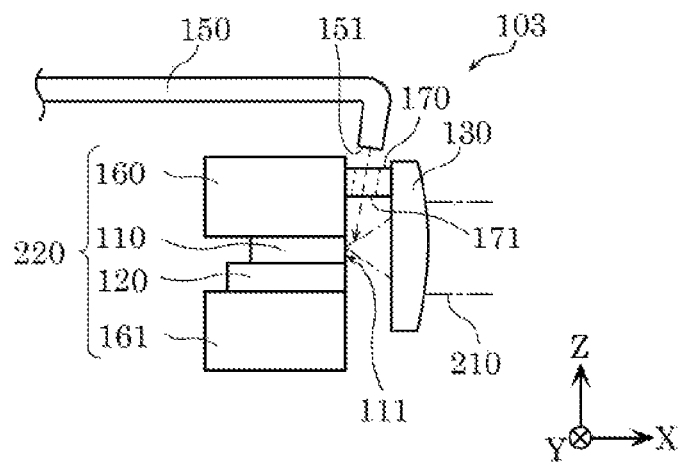
FIG. 11A is a partial side view showing an optical apparatus according to Embodiment 4.
Figure 11B:
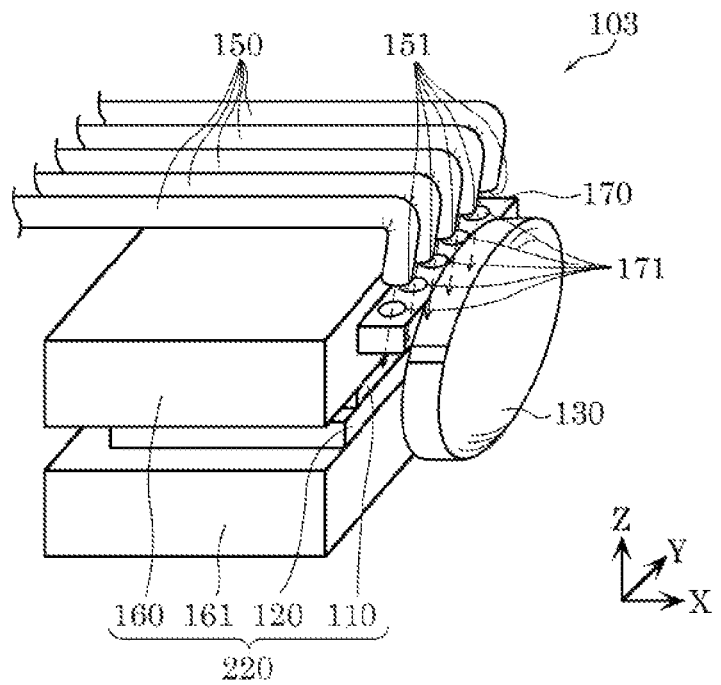
FIG. 11B is a partial perspective view showing the optical apparatus according to Embodiment 4.

In the description of the optical apparatus according to Embodiment 4, substantially the same reference characters as those of optical apparatus 100 according to Embodiment 1 are used to represent equivalent elements, and the redundant explanation thereof may be omitted or simplified.
Configuration FIG. 11A is a partial side view showing optical apparatus 103 according to Embodiment 4. FIG. 11B is a partial perspective view showing optical apparatus 103 according to Embodiment 4.

Note that FIG. 11A shows the constituent elements corresponding to those in FIG. 1C and does not show some of the constituent elements such as case 140. FIG. 11B does not show some of the constituent elements such as case 140, either.

Optical apparatus 103 is a laser module that emits laser light 210. Optical apparatus 100 is used as a laser source for a processing device for laser processing, for example. In this embodiment, optical apparatus 103 is what is called a "CAN package" laser diode module.

Optical apparatus 103 includes optical device 220, optical component 130, case 140, and a plurality of tubular bodies 150 each including spray port 151. Although not shown in the figure, like optical apparatus 100, optical apparatus 103 includes case 140 (see e.g., FIG. 1A) that houses optical device 220 and optical component 130, and gas supply device 190 that supplies the gas to tubular bodies 150.

Optical component 130 included in optical apparatus 103 is fixed to support member 160 by fixing member 170.

Fixing member 170 fixes optical component 130 to support member 160. Fixing member 170 is made of a resin material, for example.

Fixing member 170 has through-holes 171, for example.

The gas sprayed out of spray ports 151 passes through through-holes 171. Through-holes 171 are interposed between light-emitting surface 111 of semiconductor laser element 110 and spray ports 151.

Note that FIG. 11B illustrates optical apparatus 103 that includes a plurality of tubular bodies 150, that is, a plurality of spray ports 151 and fixing member 170 having a plurality of through-holes 171 corresponding to the plurality of spray ports 151. Optical apparatus 103 may include one tubular body 150, that is, one spray port 151, and fixing member 170 with one through-bole.

The shape, size, and number of through-holes 171 are not particularly limited. For example, optical apparatus 103 may include a plurality of tubular bodies 150, that is, a plurality of spray ports 151 and fixing member 170 including one through-hole 171 that is long in a top view and corresponds to the plurality of spray ports 151.

Through-hole 171 and tubular body 150 may be connected together. In this case, an opening of through-hole 171 at light-emitting surface 111 may serve as spray port 151.

Advantageous Effects

As described above, optical apparatus 103 according to Embodiment 4 includes semiconductor laser element 110, optical component 130, case 140, and flow passage sections 150. The optical apparatus further includes support member 160 and fixing member 170. Support member 160 is interposed between semiconductor laser element 110 and case 140 and supports semiconductor laser element 110. Fixing member 170 fixes optical component 130 to support member 160.

This configuration reduces changed in the relative positional relationship between semiconductor laser element 110 and optical component 130 as compared to the case where optical device 220 including semiconductor laser element 110 and optical component 130 are located in case 140, for example. Accordingly, optical apparatus 103 is easily manufactured which emits laser light 210 with desired distribution characteristics.

For example, fixing member 170 has through-holes 171 through which the gas sprayed out of spray ports 151 passes. Through-holes 171 are interposed between light-emitting surface 111 and spray ports 151.

This configuration allows the gas to pass through-holes 171 and direct spraying of the gas on light-emitting surface 111 of semiconductor laser element 110, wherever spray ports 151 and fixing member 170 are arranged. This reduces adhesion of dust or dirt onto the facet of semiconductor laser element 110, that is, light-emitting surface 111. Accordingly, degradation in the optical characteristics of semiconductor laser element 110, specifically, degradation in the optical output over time shown in FIG. 2 is reduced.

Variation 1

Figure 12A:
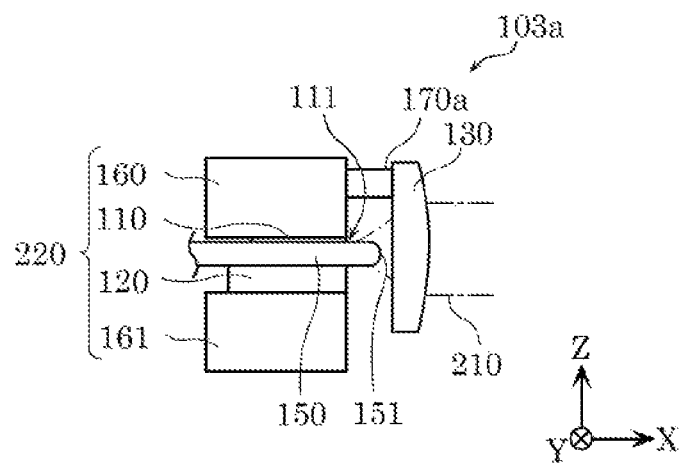
FIG. 12A is a partial side view showing an optical apparatus according to Variation 1 of Embodiment 4.
Figure 12B:
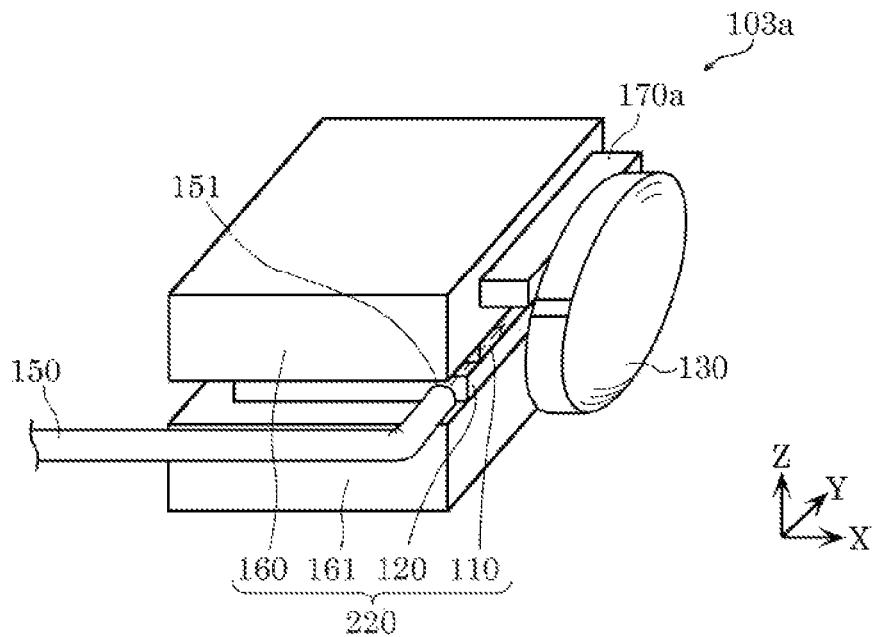
FIG. 12B is a partial perspective view showing the optical apparatus according to Variation 1 of Embodiment 4.

FIG. 12A is a partial side view showing optical apparatus 103a according to Variation 1 of Embodiment 4. FIG. 12B is a partial perspective view showing optical apparatus 103a according to Variation 1 of Embodiment 4.

Note that FIG. 12A shows the constituent elements corresponding to those in FIG. 1C and does not show some of the constituent elements such as case 140. FIG. 12B does not show some of the constituent elements such as case 140, either.

Optical apparatus 103a includes optical device 220, optical component 130, case 140, and tubular body 150 with spray port 151. Although not shown in the figure, like optical apparatus 100, optical apparatus 103a includes case 140 (see e.g., FIG. 1A) housing optical device 220 and optical component 130, and gas supply device 190 that supplies the gas to tubular body 150.

Optical component 130 included in optical apparatus 103a is fixed to support member 160 by fixing member 170a.

Fixing member 170a fixes optical component 130 to support member 160. Fixing member 170a is made of a resin material, for example.

Unlike fixing member 170, fixing member 170a has no through-hole. Spray port 151 is located on a side of semiconductor laser element 110 to spray the gas on light-emitting surface 111 of semiconductor laser element 110 from the side. This configuration allows spraying of the gas on light-emitting surface 111 of semiconductor laser element 110, even if fixing member 170 has no through-hole.

Variation 2

Figure 13A:
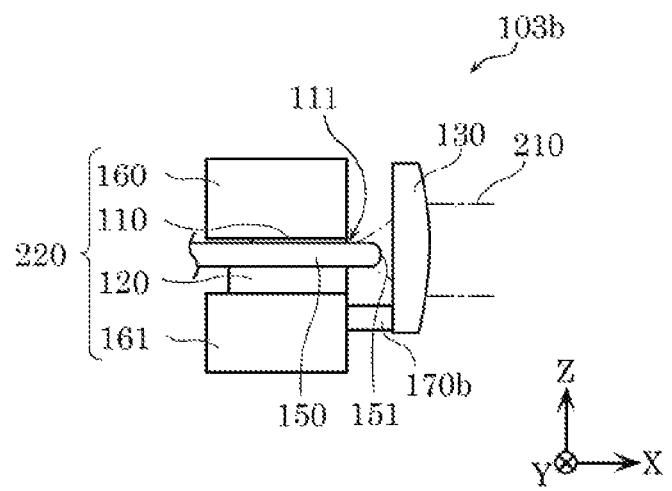
FIG. 13A is a partial side view showing an optical apparatus according to Variation 2 of Embodiment 4.
Figure 13B:
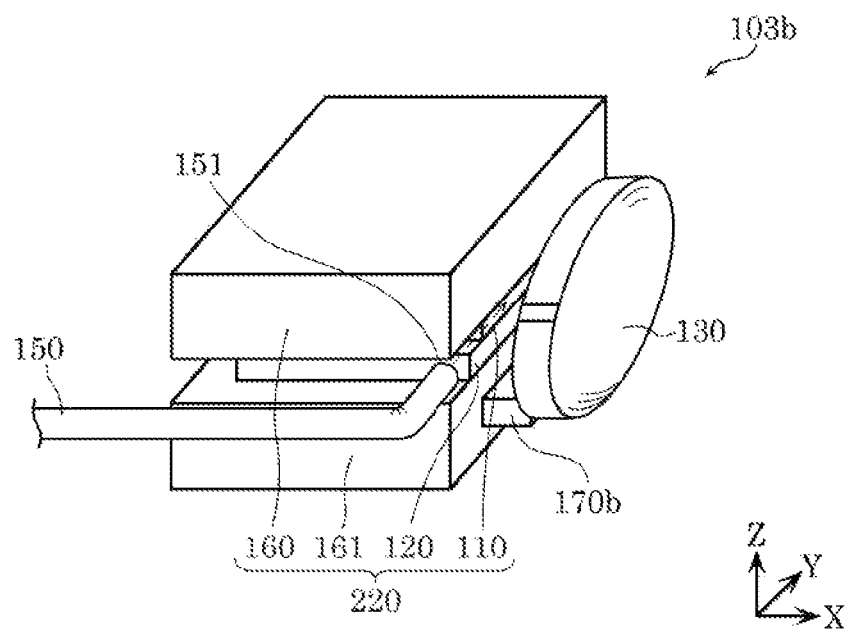
FIG. 13B is a partial perspective view showing the optical apparatus according to Variation 2 of Embodiment 4.

FIG. 13A is a partial side view showing optical apparatus 103b according to Variation 2 of Embodiment 4. FIG. 13B is a partial perspective view showing optical apparatus 103b according to Variation 2 of Embodiment 4.

Note that FIG. 13A shows the constituent elements corresponding to those in FIG. 1C and does not show some of the constituent elements such as case 140. FIG. 13B does not show some of the constituent elements such as case 140, either.

Optical apparatus 103b includes optical device 220, optical component 130, case 140, and tubular body 150 with spray port 151. Although not shown in the figure, like optical apparatus 100, optical apparatus 103b includes case 140 (see e.g., FIG. 1A) housing optical device 220 and optical component 130, and gas supply device 190 (see e.g., FIG. 1A) that supplies the gas to tubular body 150.

Optical component 130 included in optical apparatus 103b is fixed to support member 161 by fixing member 170b. In this manner, optical component 130 may be fixed to any of support member 160 and support member 161. Needless to mention, optical component 130 may be fixed to both of support member 160 and support member 161.

Fixing member 170b fixes optical component 130 to support member 161. Fixing member 170b is made of a resin material, for example.

Unlike fixing member 170, fixing member 170b has no through-hole. Spray port 151 is located on a side of semiconductor laser element 110 to spray the gas on light-emitting surface 111 of semiconductor laser element 110 from the side. This configuration allows spraying of the gas on light-emitting surface 111 of semiconductor laser element 110, even if fixing member 170b has no through-hole.

Variation 3

Figure 14A:
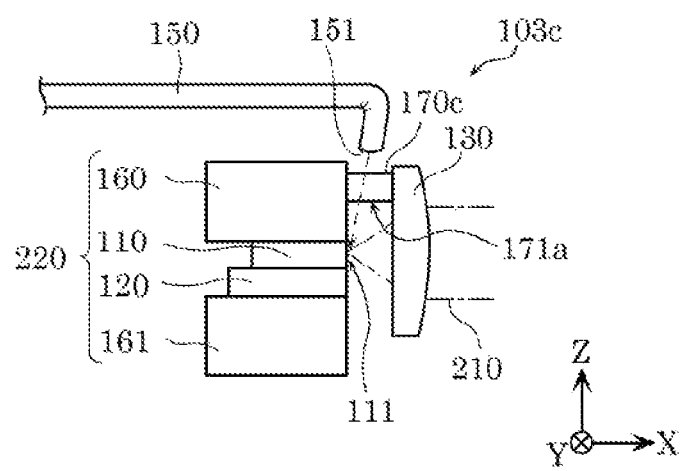
FIG. 14A is a partial side view showing an optical apparatus according to Variation 3 of Embodiment 4.
Figure 14B:
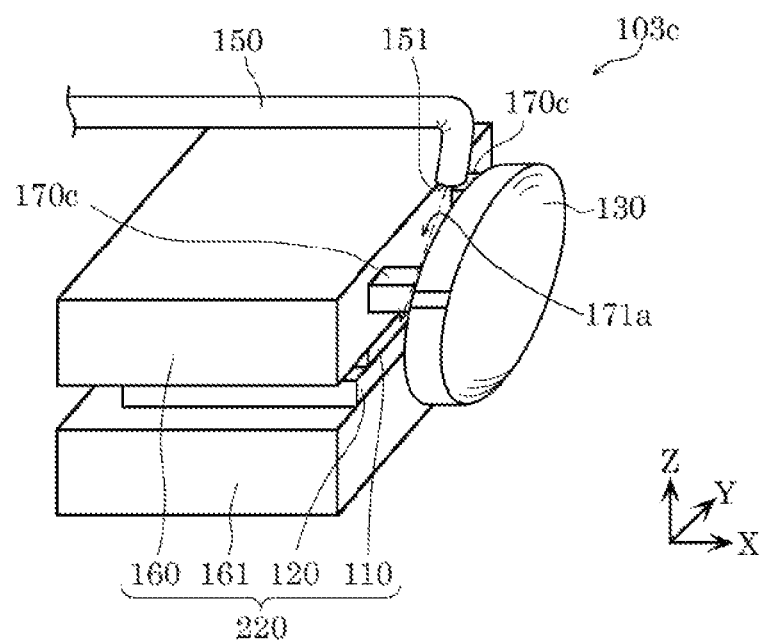
FIG. 14B is a partial perspective view showing the optical apparatus according to Variation 3 of Embodiment 4.

FIG. 14A is a partial side view showing optical apparatus 103c according to Variation 3 of Embodiment 4. FIG. 14B is a partial perspective view showing optical apparatus 103c according to Variation 3 of Embodiment 4.

Note that FIG. 14A shows the constituent elements corresponding to those in FIG. 1C and does not show some of the constituent elements such as case 140. FIG. 14B does not show some of the constituent elements such as case 140, either.

Optical apparatus 103c includes optical device 220, optical component 130, case 140, and tubular body 150 with spray port 151. Although not shown in the figure, like optical apparatus 100, optical apparatus 103c includes case 140 (see e.g., FIG. 1A) housing optical device 220 and optical component 130, and gas supply device 190 (see e.g., FIG. 1A) that supplies the gas to tubular body 150.

Optical component 130 included in optical apparatus 103c is fixed to support member 160 by two fixing members 170c. In this manner, optical component 130 may be fixed by a plurality of fixing members 170c.

Two fixing members 170c are spaced apart from each other. This configuration allows spraying of the gas on light-emitting surface 111 via through-hole 171a that is the gap between two fixing members 170c. Fixing member 170c is made of a resin material, for example.

OTHER EMBODIMENTS

While the optical apparatus according to one or more aspects has been described above based on the embodiments, the present disclosure is not limited to the embodiments. One or more aspects may include other embodiments, such as those obtained by variously modifying the embodiments as conceived by those skilled in the art or those achieved by freely combining the constituent elements in the embodiments without departing from the scope and spirit of the present disclosure.

For example, while an example has been described above in the embodiments where the flow passage section with the spray port(s) is a tubular body, the shape of the flow passage section is not particularly limited. For example, the flow passage section may be obtained by combining one or more plate members formed inside the case. The flow passage section is not necessarily in the tubular shape but may be in a gutter-shape or in any shape as long as capable of guiding the gas from the introduction port of the case to the light-emitting surface of the semiconductor laser element.

For example, in the embodiments described above, the light-emitting surface is the light-emitting surface of the semiconductor laser element. For example, if a transparent member that transmits laser light is further interposed between the semiconductor laser element and the optical component, the light-emitting surface may be the surface of the transparent member facing the optical component.

INDUSTRIAL APPLICABILITY

The optical apparatus according to the present disclosure is utilized as a laser source used in laser processing, for example.

The invention claimed is:

1. An optical apparatus, comprising:
a semiconductor laser element that emits laser light;
an optical component opposed to and spaced apart from a light-emitting surface through which the laser light is emitted;
a case that houses the semiconductor laser element and the optical component, and includes an introduction port for introducing gas and an exhaust port for exhausting the gas; and
a flow passage section including a spray port for spraying the semiconductor laser element with the gas introduced from the introduction port,
wherein the flow passage section includes the spray port for spraying the light-emitting surface with the gas introduced from the introduction port.

2. The optical apparatus according to claim 1, wherein as viewed in a direction parallel to the light-emitting surface, the spray port is interposed between the semiconductor laser element and the optical component.

3. The optical apparatus according to claim 1, wherein the flow passage section is a tubular body that connects the introduction port and the spray port together and includes a flow passage through which the gas passes.

4. The optical apparatus according to claim 1, further comprising:
a support member that is interposed between the semiconductor laser element and the case and supports the semiconductor laser element; and
a fixing member that fixes the optical component to the support member.

5. The optical apparatus according to claim 4, wherein the fixing member includes a through-hole through which the gas sprayed out of the spray port passes, and
the through-hole is interposed between the light-emitting surface and the spray port.

6. The optical apparatus according to claim 1, further comprising:
a circulation device that is connected to the introduction port and the exhaust port outside the case, and circulates the gas inside the case by exhausting the gas from the exhaust port and introducing, from the introduction port, the gas exhausted from the exhaust port.

7. An optical apparatus, comprising:
a semiconductor laser element that emits laser light;
an optical component opposed to and spaced apart from a light-emitting surface through which the laser light is emitted;
a case that houses the semiconductor laser element and the optical component, and includes an introduction port for introducing gas and an exhaust port for exhausting the gas; and
a flow passage section including a plurality of spray ports for spraying the semiconductor laser element with the gas introduced from the introduction port,
each of the plurality of spray ports sprays the semiconductor laser element with the gas.

8. The optical apparatus according to claim 7, further comprising:
a plurality of semiconductor laser elements each being the semiconductor laser element, wherein
the plurality of spray ports are arranged in a one-to-one correspondence to the plurality of semiconductor laser elements.

9. An optical apparatus, comprising:
a semiconductor laser element that emits laser light;
an optical component opposed to and spaced apart from a light-emitting surface through which the laser light is emitted;
a case that houses the semiconductor laser element and the optical component, and includes an introduction port for introducing gas and an exhaust port for exhausting the gas; and
a flow passage section including a spray port for spraying the semiconductor laser element with the gas introduced from the introduction port,
wherein the gas contains oxygen.

10. The optical apparatus according to claim 9, wherein the gas further contains at least one of nitrogen, hydrogen, helium, argon, halogen-based gas, or halogen compound gas.

* * * * *